Figure 1:
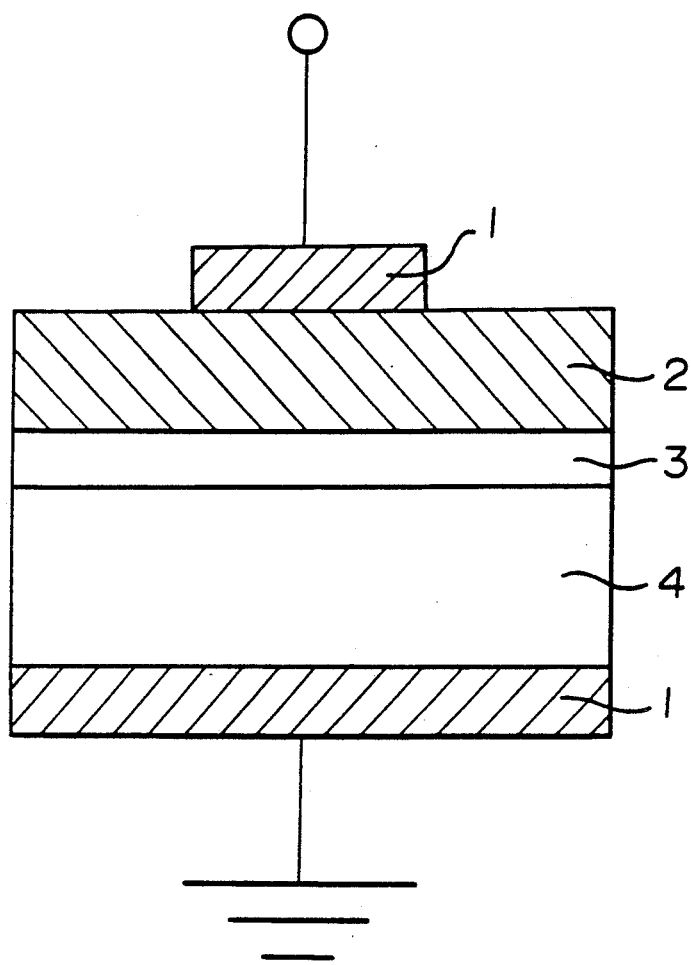

United States Patent [19]

Kohtoh et al.

[11] Patent Number: 5,059,677

[45] Date of Patent: Oct. 22, 1991

[54] POLYIMIDE RESIN AND INSULATING FILM FOR ELECTRIC AND ELECTRONIC DEVICES

[75] Inventors: Noriaki Kohtoh; Takashi Kobayashi; Masahiko Yukawa, all of Ichihara, Japan

[73] Assignee: Nissan Chemical Industries, Ltd., Tokyo, Japan

[21] Appl. No.: 293,766

[22] Filed: Jan. 5, 1989

[30] Foreign Application Priority Data

Jan. 8, 1988 [JP] Japan ................................. 63-1935
Jul. 11, 1988 [JP] Japan ............................. 63-172157

[51] Int. Cl.⁵ .................... C08G 8/02; C08G 14/00; C08G 63/00; C08G 69/26
[52] U.S. Cl. .................................. 528/353; 528/125; 528/126; 528/128; 528/172; 528/185; 528/350
[58] Field of Search ............... 528/353, 125, 126, 128, 528/172, 185, 350

[56] References Cited

U.S. PATENT DOCUMENTS 4,358,579 11/1982 Nimry et al. .................... 528/188
4,681,928 7/1987 Berger et al. .................... 528/353

OTHER PUBLICATIONS

Polymer, 1973, vol. 14, Sep. "Aliphatic poly(amido acids) and polyimides with cyclobutane ring in the man chain" pp. 440–444.

Primary Examiner—John Kight, III
Assistant Examiner—P. Hampton-Hightower
Attorney, Agent, or Firm—Oblon, Spivak, McClelland, Maier & Neustadt

[57] ABSTRACT

A polyimide resin having a repeating unit of the formula:

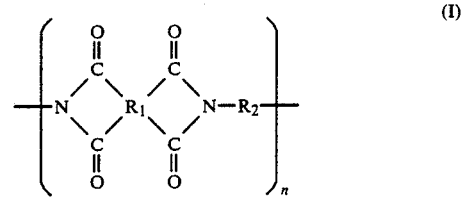

wherein $R_1$ is a tetravalent organic group constituting a tetracarboxylic acid or its derivative, wherein four atoms directly bonded to the four carbonyl groups are carbon atoms having no unsaturated bond, and $R_2$ is a bivalent organic group constituting a diamine.

1 Claim, 10 Drawing Sheets

POLYIMIDE RESIN AND INSULATING FILM FOR ELECTRIC AND ELECTRONIC DEVICES

The present invention relates to a polyimide resin and an insulating film useful for electric and electronic devices, particularly for semiconductor devices. More particularly, the present invention relates to a polyimide resin having low polarizability, low discoloration and high transparency and an insulating layer having excellent electric properties, heat resistance and adhesion, which is useful for junction coating, passivation, moisture-proofing, buffer coating, α-ray shielding and layer insulation.

Polyimide resins obtained by reacting aromatic tetracarboxylic acids or their derivatives with diamines exhibit excellent heat resistance and chemical resistance, and they are practically used for various applications. With respect to the application of polyimide resins to semiconductor devices, it is known to coat a polyimide resin on a pn-junction to protect the exposed end surface of the pn-junction formed on a semiconductor substrate (junction coating film), to coat a polyimide resin over the surface of a semiconductor element to prevent it from contamination from the surrounding environment (passivation film), to coat a polyimide resin on a passivation film to improve the moisture-proofing properties of the semiconductor element (moisture-proofing film), to coat a polyimide resin on a passivation film for mechanical protection of the semiconductor element (buffer coating film), to coat a polyimide resin on a passivation film to prevent soft error of a memory element due to α-rays (α-ray shielding film) or to form a polyimide resin layer between wiring layers to effect the insulation between the wiring layers (interlevel dielectric film), and some of such applications are practically in use, as disclosed in Functional Materials, July 1983 issue, page 9, published by Kabushiki Kaisha CMC.

Further, Japanese Unexamined Patent Publications No. 32827/1985 and No. 208358/1985 disclose that polyimide resins obtained from certain aromatic tetracarboxylic acid dianhydrides and aromatic diamines, exhibit low thermal expansion, and they are useful for application to semiconductor devices. The aromatic tetracarboxylic acid dianhydrides used in these publications are aromatic tetracarboxylic acid dianhydrides such as pyromellitic dianhydride and biphenyltetracarboxylic dianhydride.

However, when such polyimide resins are to be used in the above-mentioned various applications, their electric properties are still inadequate in many cases.

Namely, polyimide resins are known to have a drawback that when a voltage is applied, they are likely to be polarized to give an influence to the surface of the semiconductor element, whereby the element characteristics tend to change (CMC Technical Report, No. 27, Special Coating Materials for Electronics, p. 88, published by Kabushiki Kaisha CMC).

Further, it has been reported that the polarization (space charge polarization) of polyimide resins was quantitatively analyzed by measuring the capacity-voltage (hereinafter referred to simply as C-V) characteristics, and the polyimide resins were found to be substantially polarized when a voltage was applied (Annual Report Conference on Electrical Insulation and Dielectric Phenomena), 1985, p. 176–181, National Academy of Science, Washington, U.S.A.).

It is therefore an object of the present invention to provide a novel polyimide resin which has excellent electric properties with low polarizability i.e. being hardly polarizable even upon application of a voltage and which also has excellent heat resistance, adhesion and transparency.

The present inventors have conducted extensive researches to solve the above problems and as a result, have found that a polyimide resin obtained by using a tetracarboxylic acid or its derivative wherein four atoms directly bonded to the four carbonyl groups constituting the tetracarboxylic acid or its derivative are carbon atoms having no unsaturated bond, is capable of forming an insulating film for electric and electronic devices, which is hardly polarized upon application of a voltage and thus has excellent electric properties with low polarizability and which also has excellent heat resistance, adhesion and transparency. The present invention has been accomplished on the basis of this discovery.

The present invention provides a polyimide resin having a repeating unit of the formula:

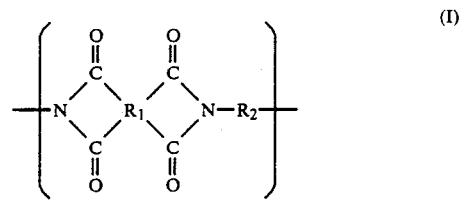

wherein $R_1$ is a tetravalent organic group constituting a tetracarboxylic acid or its derivative, wherein four atoms directly bonded to the four carbonyl groups are carbon atoms having no unsaturated bond, and $R_2$ is a bivalent organic group constituting a diamine.

The present invention also provides an insulating film for an electric or electronic device, made of such a polyimide resin.

Now, the present invention will be described in detail with reference to the preferred embodiments.

A BRIEF DESCRIPTION OF THE DRAWINGS

FIG. 1 is a diagrammatical view illustrating a metal polyimide oxide semiconductor (MPOS) model element in Examples and Comparative Examples given hereinafter.

FIGS. 2 to 10 are graphs showing C-V characteristics, wherein the ordinate $C/C_0$ indicates a ratio (%) of the electrostatic capacity to an electrostatic capacity under a bias voltage of +15 V, and the abscissa indicates the bias voltage (V). The down-directed arrow indicates sweepage from positive to negative direction, and the up-directed arrow indicates sweepage from negative to positive direction.

Specific examples of the tetracarboxylic acid or its derivative to be used to obtain the polyimide resin of the formula (I) of the present invention, include tetracarboxylic acids such as 1,2,3,4-butanetetracarboxylic acid, cyclobutanetetracarboxylic acid, cyclopentanetetracarboxylic acid, cyclohexanetetracarboxylic acid and 3,4-dicarboxy-1,2,3,4-tetrahydro-1-naphthalenesuccinic acid, dianhydrides thereof and dicarboxylic acid diacid halides. These tetracarboxylic acids and their derivatives may be used alone or in combination as a mixture of two or more.

Further, to an extent not to impair the effects of the present invention, a tetracarboxylic acid wherein four atoms directly bonded to the four carbonyl groups are carbon atoms having unsaturated bonds, or its derivative, may be incorporated. Specific examples of such a tetracarboxylic acid or its derivative, include tetracarboxylic acids such as pyromellitic acid, benzophenonetetracarboxylic acid and biphenyltetracarboxylic acid, and their dianhydrides, and dicarboxylic acid diacid halides.

Specific examples of the diamine used to obtain the polyimide resin of the formula I of the present invention, include aromatic diamines such as p-phenylenediamine, m-phenylenediamine, diaminodiphenylmethane, diaminodiphenyl ether, 2,2-diaminodiphenylpropane, diaminodiphenylsulfone, diaminobenzophenone, diaminonaphthalene, 1,3-bis(4-aminophenoxy)benzene, 1,4-bis(4-aminophenoxy)benzene, 4,4'-di(4-aminophenoxy)-diphenylsulfone and 2,2'-bis[4-(4-aminophenoxy)-phenyl]propane. Further, alicyclic diamines or aliphatic diamines may also be used depending upon the particular purpose.

These diamines may be used alone or in combination as a mixture of two or more.

Among the compounds of the formula I, those represented by the following formula II have been unexpectedly found to have low thermal expansion properties in addition to the above-mentioned low polarizability, low discoloration and high transparency.

Namely, the present invention provides a polyimide resin with low thermal expansion properties having a repeating unit of the formula:

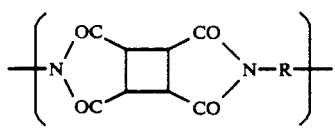

(II)

wherein R is a bivalent organic group constituting a diamine selected from the group consisting of

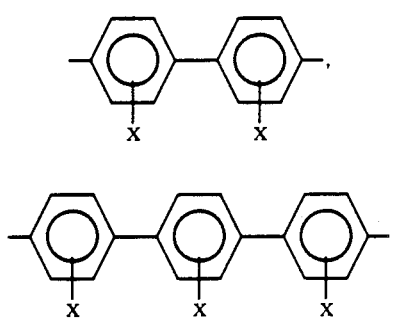

and

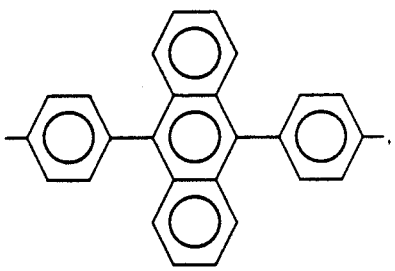

wherein X is a hydrogen atom, an alkyl group, an acyl group, an alkoxy group or a halogen atom.

The tetracarboxylic acid or its derivative used to obtain the polyimide resin with low thermal expansion properties of the present invention includes cyclobutanetetracarboxylic acid and its dianhydride, and dicarboxylic acid diacid halides.

Further, an aromatic tetracarboxylic acid or its derivative may be incorporated to such an extent not to impair the low polarizability, low discoloration and high transparency. Specific examples of such a tetracarboxylic acid or its derivative, include tetracarboxylic acids such as pyromellitic acid, benzophenonetetracarboxylic acid and biphenyltetracarboxylic acid, and their dianhydrides, and dicarboxylic acid dihalides.

Specific examples of the diamine used to obtain the polyimde resin of the formula II, include aromatic diamines such as benzidine, 3,3'-dimethoxy-4,4'-diaminobiphenyl, 3,3'-dimethyl-4,4'-diaminobiphenyl, 4,4'-diamino-p-terphenyl and 9,10-bis(4-aminophenyl)anthracene.

There is no particular restriction as to the polymerization method to obtain the polyimide resins of the formulas I and II of the present invention. However, it is preferred to employ a method wherein a polyimide resin precursor is prepared by reacting tetracarboxylic acid or its derivative with a diamine, followed by dehydration for ring closure.

The reaction temperature of the tetracarboxylic acid or its derivative with the diamine can be optionally selected within a range of from −20° to 150° C., preferably from −5° to 100° C. For the conversion of the polyimide resin precursor to a polyimide resin, it is usual to employ a method wherein the dehydration for ring closure is conducted by heating. The dehydration for ring closure by heating may be conducted within a temperature range of from 150° to 450° C., preferably from 170° to 350° C.

The time required for the dehydration for ring closure is usually from 30 seconds to 10 hours, preferably from 5 minutes to 5 hours, although it depends on the reaction temperature.

As an alternative method for converting the polyimide resin precursor to the polyimide resin, a conventional catalyst for dehydration for ring closure may be used to conduct the ring closure chemically.

A solution of the polyimide resin or the polyimide resin precursor obtained from the tetracarboxylic acid or its derivative and the diamine according to the present invention may be coated on a semiconductor device by a spin coating method or a printing method and heated for curing to form an insulating film for junction coating, passivation, moisture-proofing, buffer coating, α-ray shielding or layer insulation.

The polyimide resin of the formula I of the present invention exhibits excellent electric properties with low polarizability even when a voltage is applied and also has excellent heat resistance, adhesion and transparency.

Further, the polyimide resin of the formula II as a preferred embodiment of the present invention has low thermal expansion properties as well as low polarizability, low discoloration and high transparency.

The polyimide resins represented by the formulas I and II are useful for electric and electronic devices particularly for semiconductor devices.

Now, the present invention will be described in further detail with reference to Examples. However, it should be understood that the present invention is by no means restricted to such specific Examples.

EXAMPLE 1

10.61 g of diaminodiphenyl ether and 10.03 g of cyclobutanetetracarboxylic acid dianhydride were reacted in 122 g of N-methyl-2-pyrrolidone (hereinafter referred to simply as NMP) at room temperature for 4 hours to obtain a solution of a polyimide resin precursor. The solution of the polyimide resin precursor had a solid content of 14.5% by weight and a viscosity of 5.8 ps.

This solution was diluted with NMP to a total solid content of 7.0% by weight and spin-coated on a n type silicon substrate having a thermal oxide film of 1,000 Å formed thereon, followed by heat treatment at 300° C. for 60 minutes to form a polyimide resin film. The polyimide resin film thus obtained had a thickness of 2,000 Å. On the polyimide resin film, an aluminum electrode having a diameter of 2 mm was formed by vacuum vapor deposition, and on the rear side of the silicon substrate, an aluminum electrode was formed. Prior to the formation of the aluminum electrode on the rear side of the silicon substrate, etching treatment was applied with hydrofluoric acid.

Thus, a metal polyimide oxide semiconductor (hereinafter referred to simply as MPOS) model element was prepared, and the C-V characteristics were measured.

FIG. 1 shows a diagrammatical view of the MPOS model element. In FIG. 1, reference numeral 1 indicates the aluminum electrode, numeral 2 indicates the polyimide resin (thickness: 2,000 Å), numeral 3 indicates the thermal oxide film (thickness: 1,000 Å), and numeral 4 indicates the silicon substrate.

The C-V characteristics were measured under the following conditions. Namely, the model element was left at +15 V for 40 seconds, then swept with a negative voltage at 2 V/sec., then left at −15 V for 40 seconds, and finally swept with a positive voltage at 2 V/sec. until the voltage reached +15 V.

Figure 2:
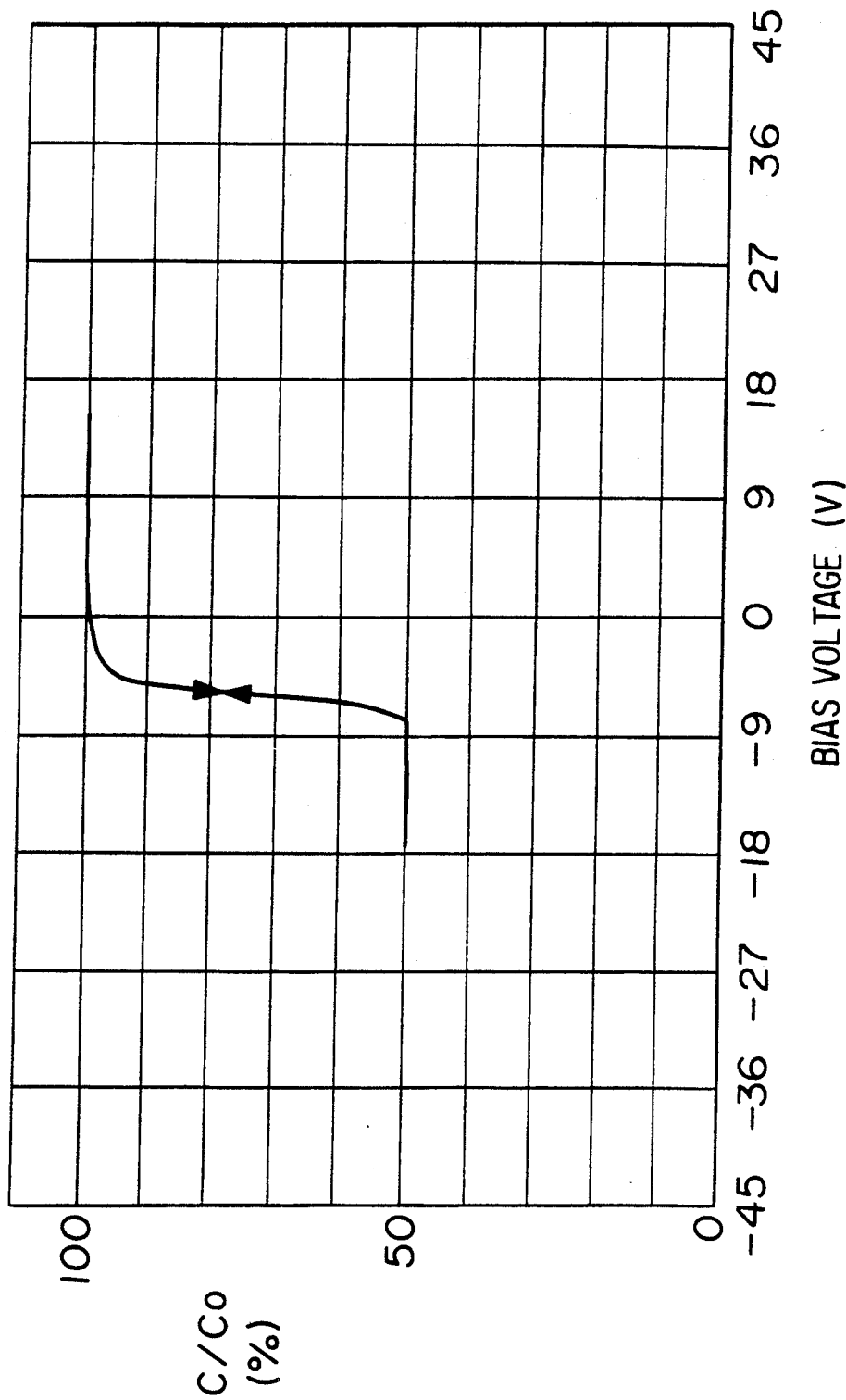

The C-V characteristics obtained by the above measurement are shown in FIG. 2. In FIG. 2, the ordinate $C/C_0$ indicates a ratio (%) of the electrostatic capacity to an electrostatic capacity under a bias voltage of +15 V, and the abscissa indicates the bias voltage (V). The down-directed arrow indicates the sweepage from positive to negative direction, and the up-directed arrow indicates sweepage from negative to positive direction. (The same applies to FIGS. 3 to 10.)

It is evident from FIG. 2 that the C-V curves are consistent irrespective of the direction of the sweepage with the bias voltage, and thus the polyimide resin is not polarized.

The C-V characteristics are described in detail in J. Electrochem. Soc., Vol. 121, No. 6, 198C.

EXAMPLE 2

12.57 g of 1,4-bis(4-aminophenoxy)benzene and 8.09 g of cyclobutanetetracarboxylic acid dianhydride were reacted in 117 g of NMP at room temperature for 4 hours to obtain a solution of a polyimide resin precursor. The solution of the polyimide resin precursor thus obtained had a solid content of 15.0% by weight and a viscosity of 5.6 ps. The subsequent operation was conducted in the same manner as in Example 1 to obtain the C-V characteristics as shown in FIG. 3.

Figure 3:
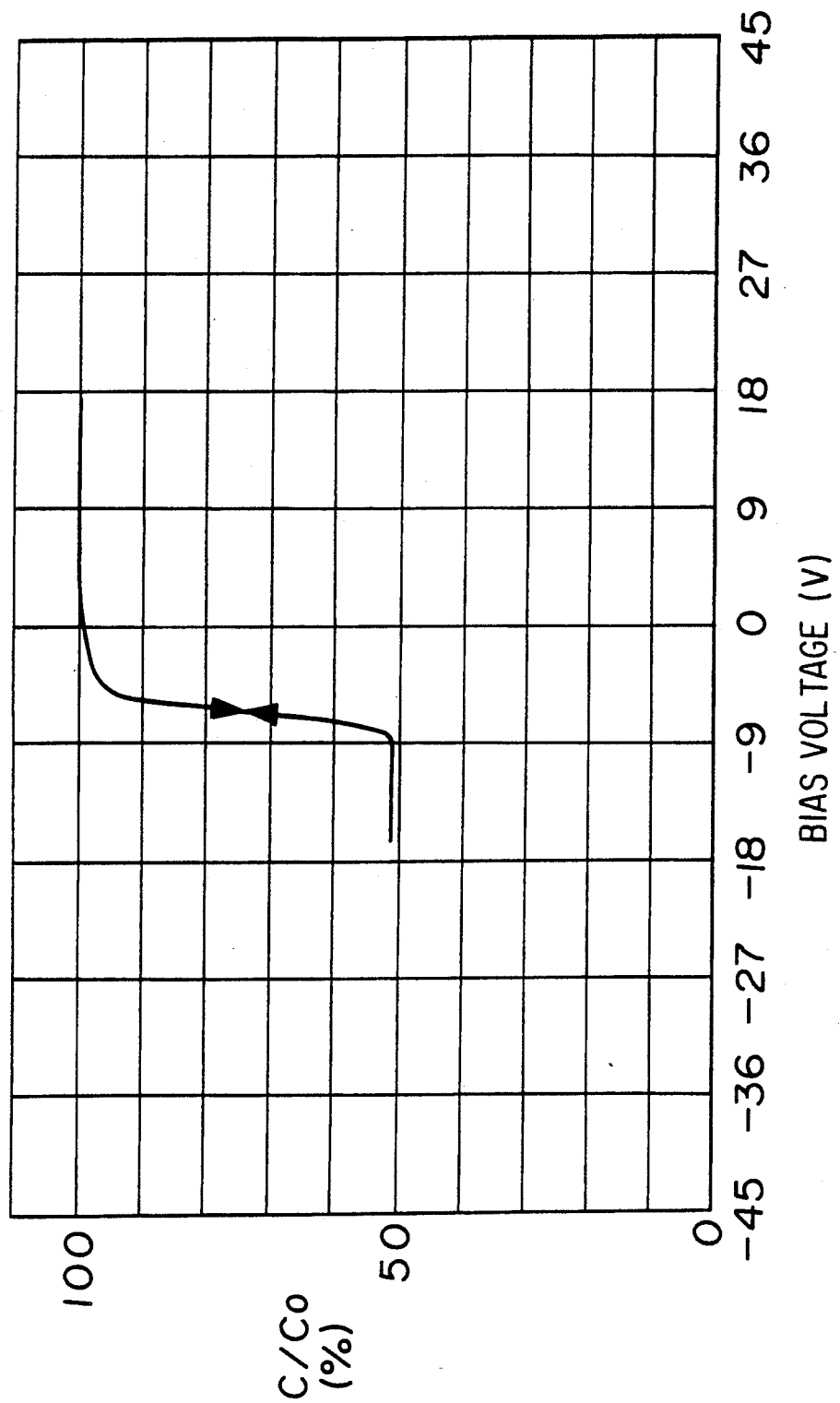

It is evident from FIG. 3 that the C-V curves are consistent irrespective of the direction of sweepage with the bias voltage, and thus the polyimide resin is not polarized.

EXAMPLE 3

5.85 g of 1,4-bis(4-aminophenoxy)benzene and 5.89 g of 3,4-dicarboxy-1,2,3,4-tetrahydro-1-naphthalenesuccinic acid dianhydride were reacted in 101 g of NMP at room temperature for 24 hours to obtain a solution of a polyimide resin precursor. The solution of the polyimide resin precursor thus obtained had a solid content of 10.4% by weight and a viscosity of 70.3 cps.

Figure 4:
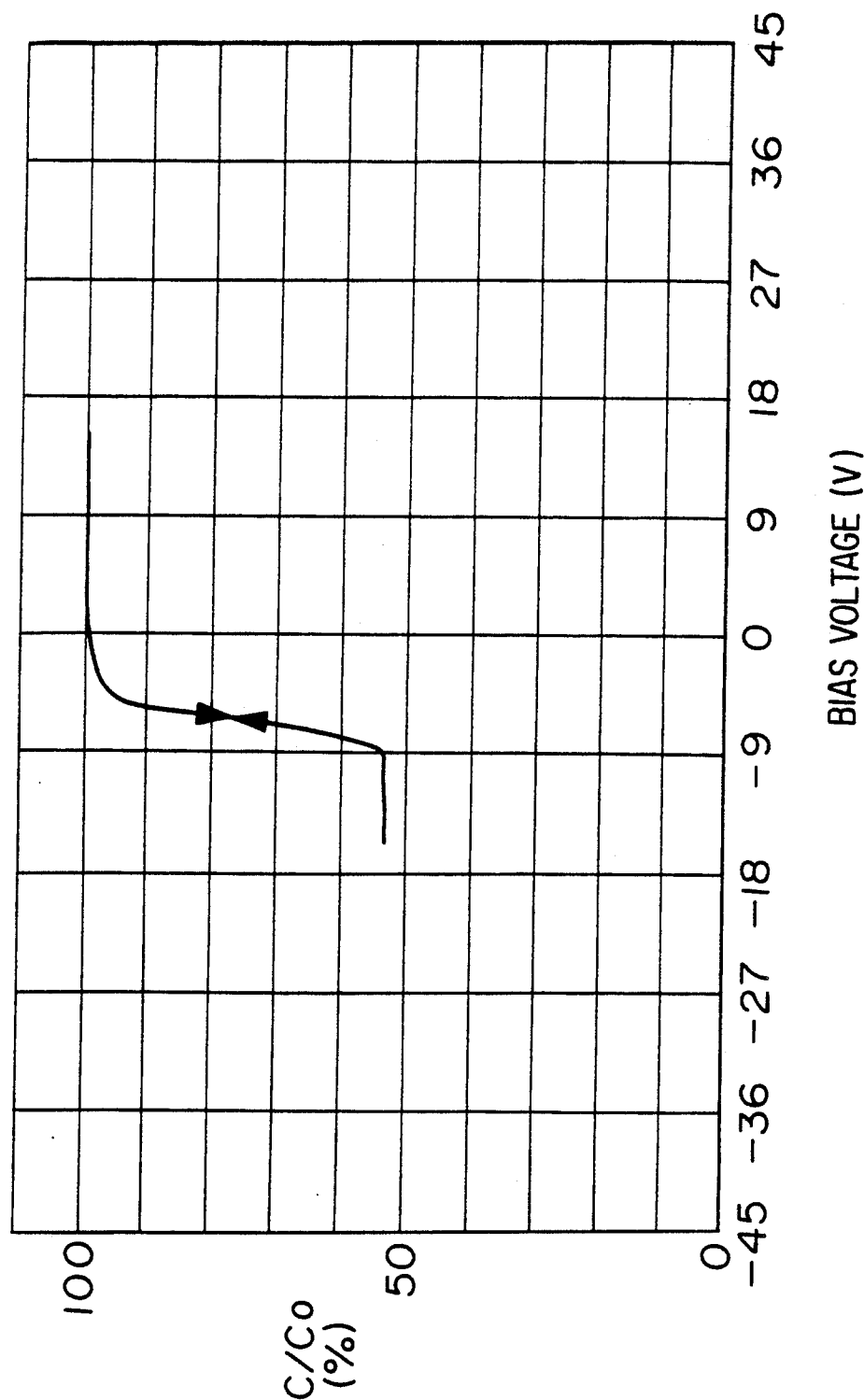

The subsequent operation was conducted in the same manner as in Example 1 except that the heat treatment temperature after spin coating was changed to 200° C., to obtain the C-V characteristics as shown in FIG. 4.

It is evident from FIG. 4 that the C-V curves are consistent irrespective of the direction of sweepage with the bias voltage, and thus the polyimide resin is not polarized.

EXAMPLE 4

11.92 g of 4,4′-diamino-3,3′-dimethyldicyclohexylmethane and 10.30 g of cyclobutanetetracarboxylic acid dianhydride were reacted in 187 g of NMP at room temperature for 48 hours to obtain a solution of a polyimide resin precursor. The solution of the polyimide resin precursor thus obtained had a solid content of 10.6% by weight and a viscosity of 18.9 ps.

Figure 5:
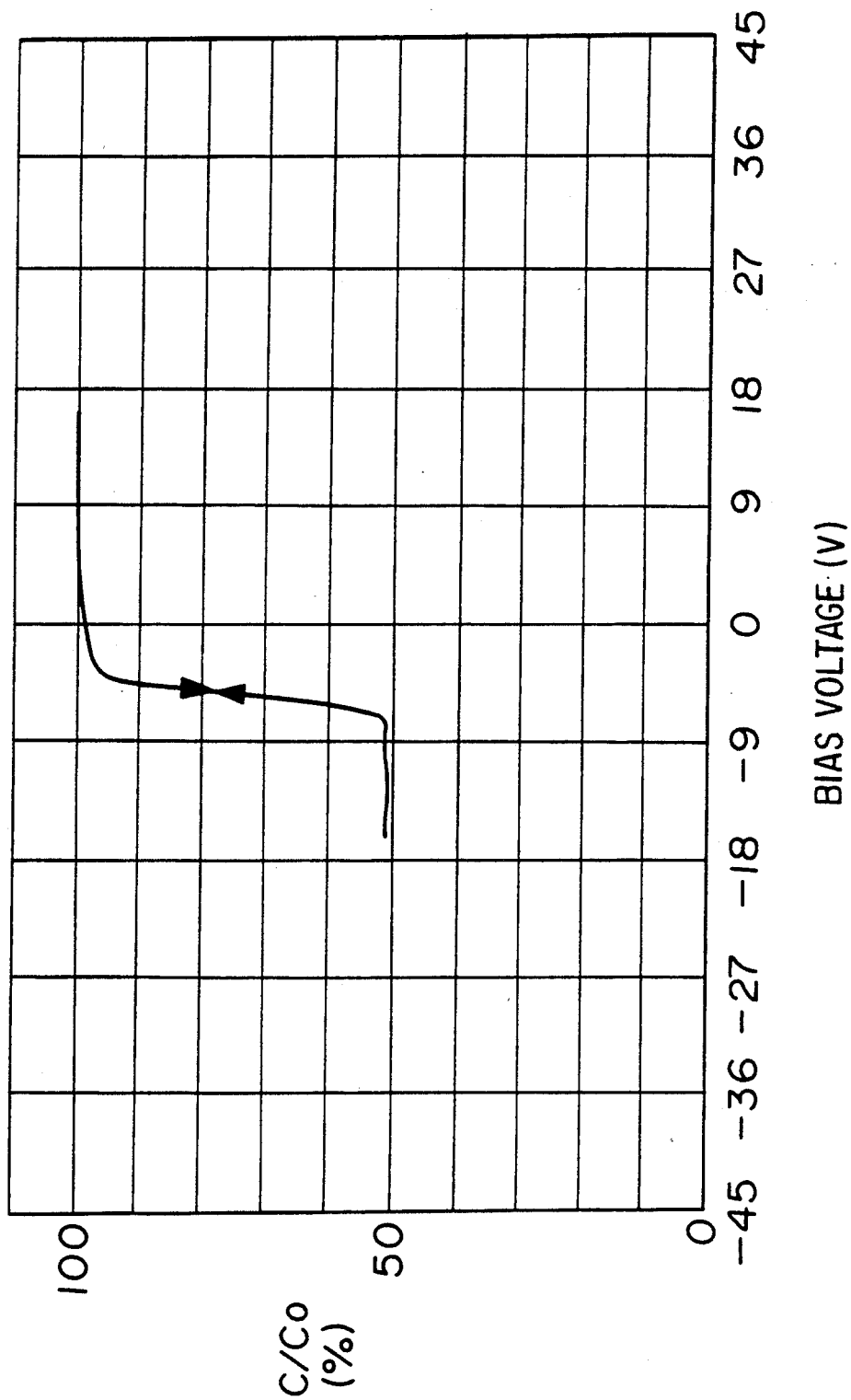

The subsequent operation was conducted in the same manner as in Example 1 except that the heat treatment temperature after spin coating was changed to 200° C., to obtain the C-V characteristics as shown in FIG. 5.

It is evident from FIG. 5 that the C-V curves are consistent irrespective of the direction of sweepage with the bias voltage, and thus the polyimide resin in not polarized.

COMPARATIVE EXAMPLE 1

19.66 g of diaminodiphenyl ether and 20.34 g of pyromellitic acid dianhydride were reacted in 460 g of NMP at room temperature for 4 hours to obtain a solution of a polyimide resin precursor. The solution of the polyimide resin precursor thus obtained had a solid content of 8.0% by weight and a viscosity of 161 cps.

Figure 6:
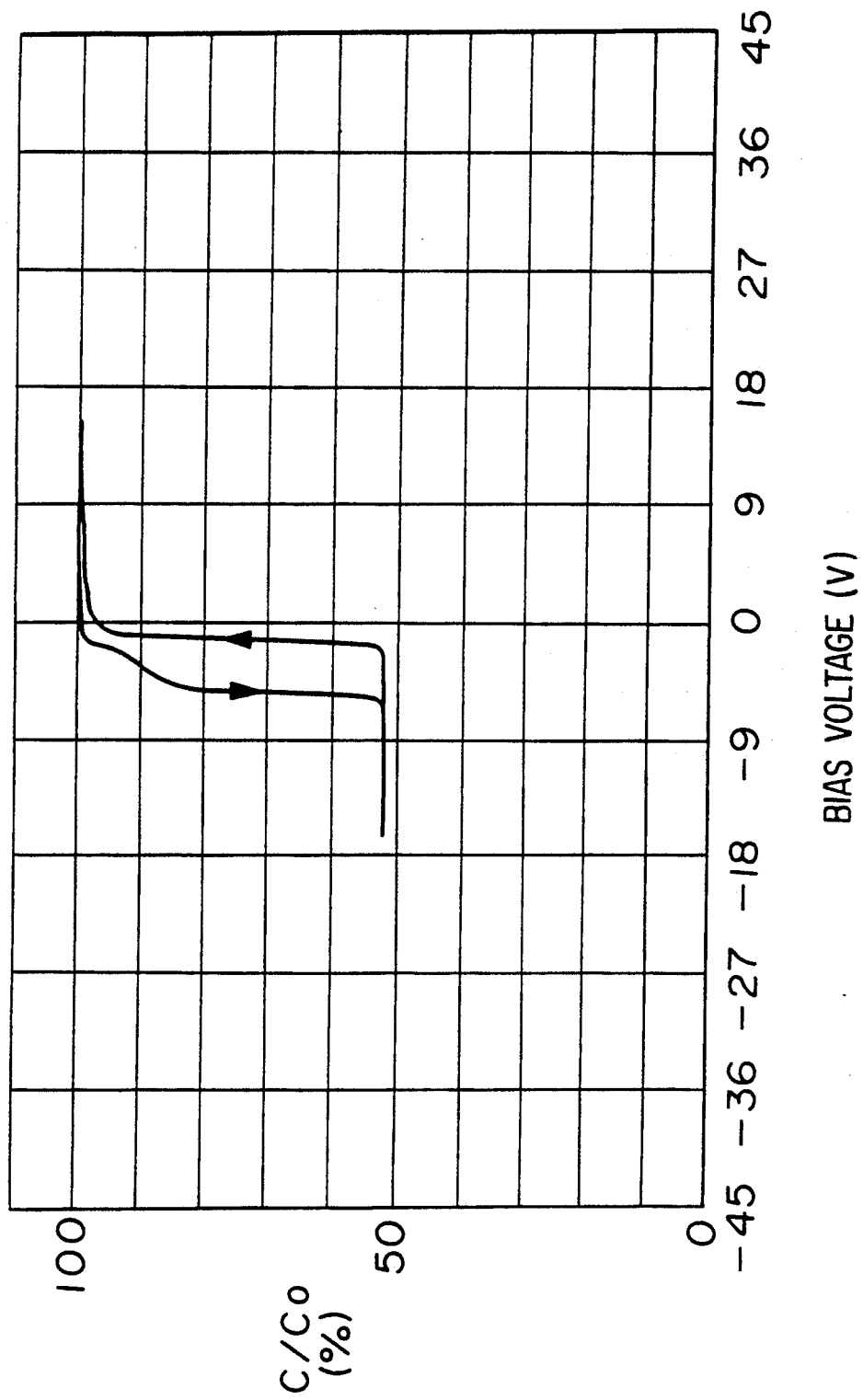

The subsequent operation was conducted in the same manner as in Example 1 to obtain the C-V characteristics as shown in FIG. 6.

It is evident from FIG. 6 that a hysteresis appears in the C-V curve when the direction of sweepage with the bias voltage is different, and thus the polyimide resin is polarized.

COMPARATIVE EXAMPLE 2

14.62 g of 1,4-bis(4-aminophenoxy)benzene and 10.69 g of pyromellitic acid dianhyride were reacted in 180 g of NMP at room temperature for 4 hours to obtain a solution of a polyimide resin precursor. The solution of the polyimide resin precursor thus obtained had a solid content of 12.3% by weight and a viscosity of 31.7 ps.

Figure 7:
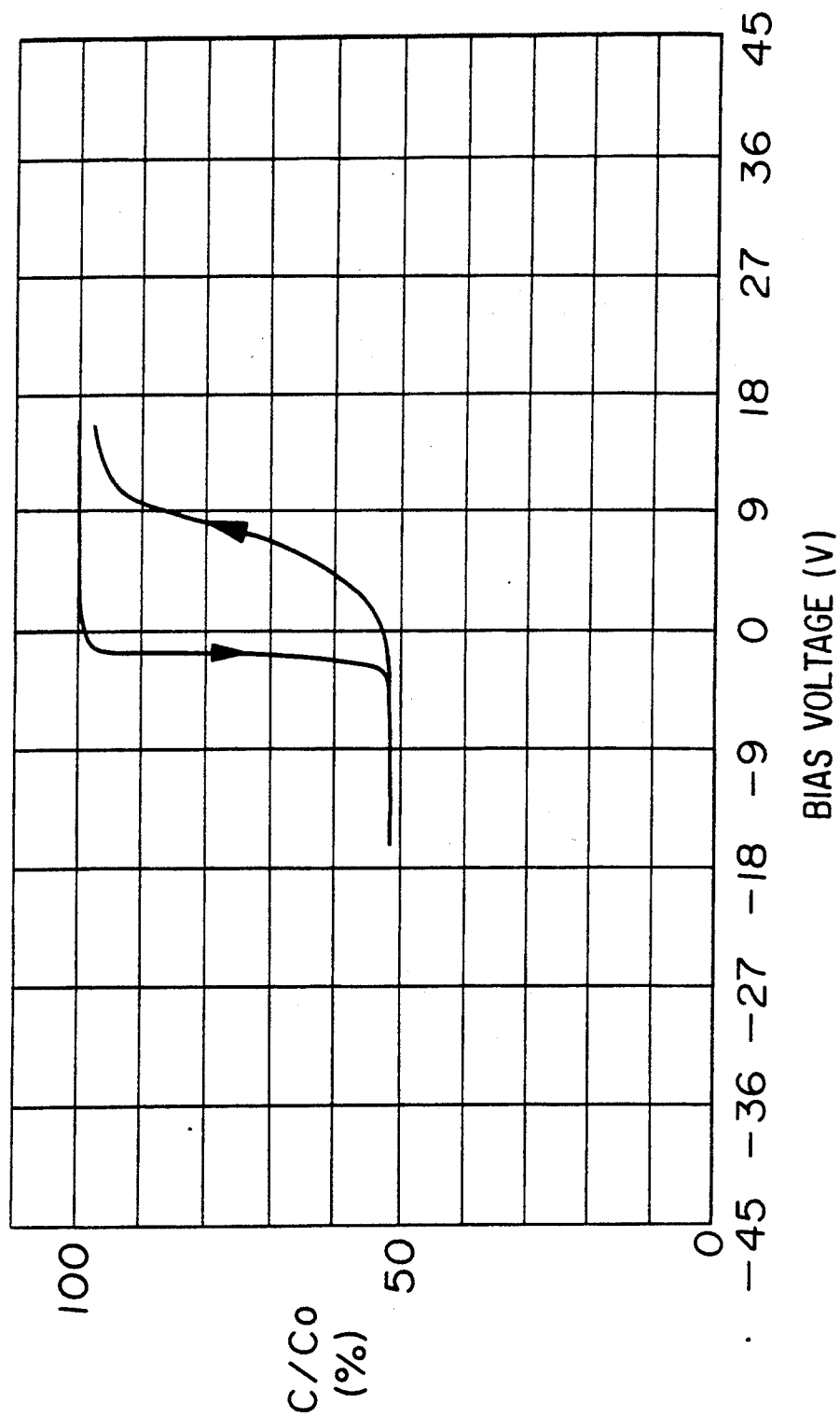

The subsequent operation was conducted in the same manner as in Example 1 to obtain the C-V characteristics as shown in FIG. 7.

It is evident from FIG. 7 that a hysteresis appears in the C-V curve when the direction of sweepage with the bias voltage is different, and thus the polyimide resin is polarized.

COMPARATIVE EXAMPLE 3

10.01 g of diaminodiphenyl ether and 15.79 g of benzophenonetetracarboxylic acid dianhydride were reacted in 177 g of NMP at room temperature for 4 hours to obtain a solution of a polyimide resin precursor. The solution of the polyimide resin precursor thus obtained had a solid content of 12.7% by weight and a viscosity of 435 cps.

Figure 8:
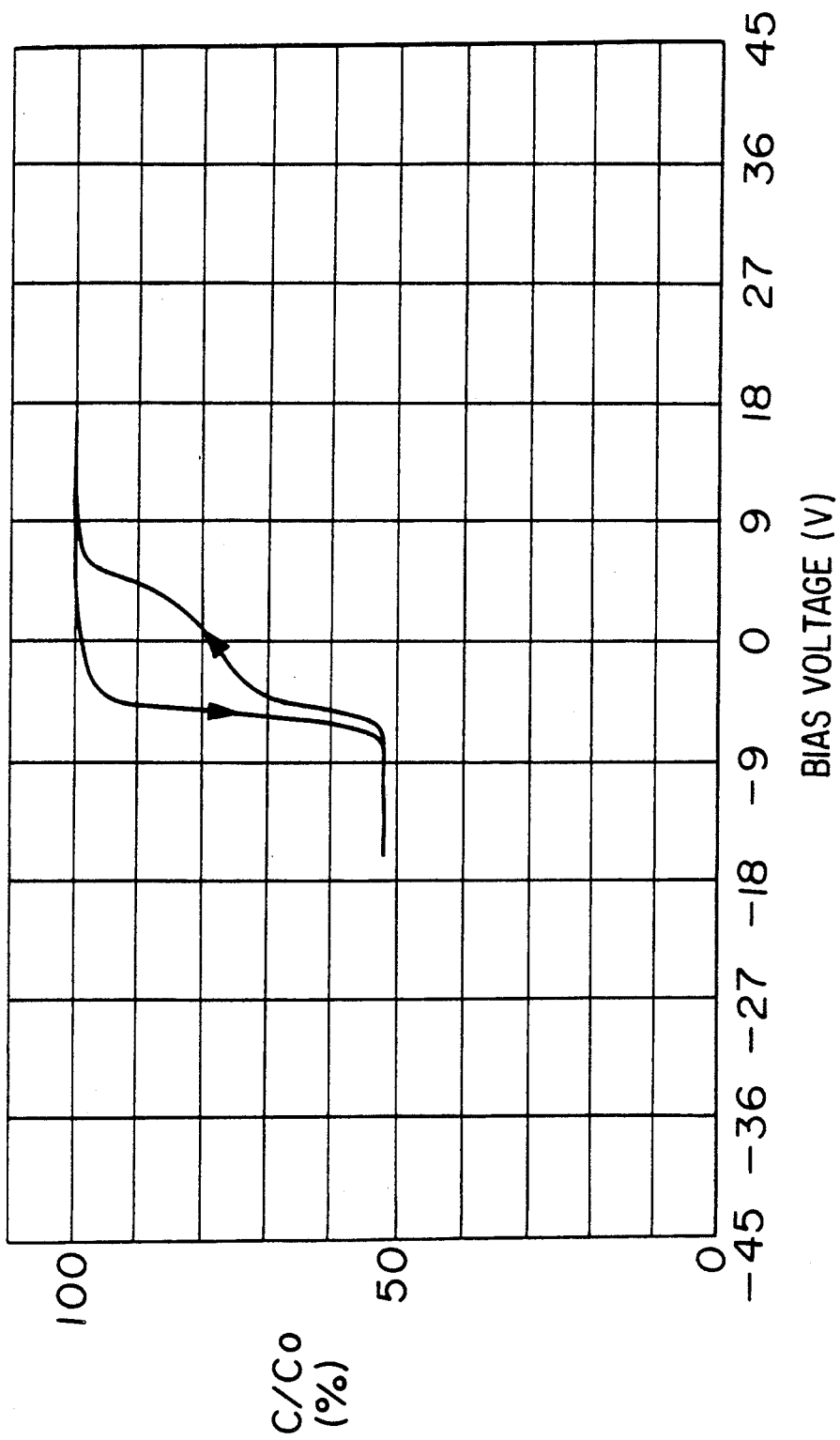

The subsequent operation was conducted in the same manner as in Example 1 to obtain the C-V characteristics as shown in FIG. 8. It is evident from FIG. 8 that a hysteresis appears in the C-V curve when the direction of sweepage with the bias voltage is different and thus the polyimide resin is polarized.

COMPARATIVE EXAMPLE 4

11.92 g of 4,4'-diamino-3,3'-dimethyldicyclohexylmethane and 11.45 g of pyromellitic acid dianhydride were reacted in 200 g of NMP at room temperature for 20 hours to obtain a solution of a polyimide resin precursor. The solution of the polyimide resin precursor thus obtained had a solid content of 10.5% by weight and a viscosity of 16.2 ps.

Figure 9:
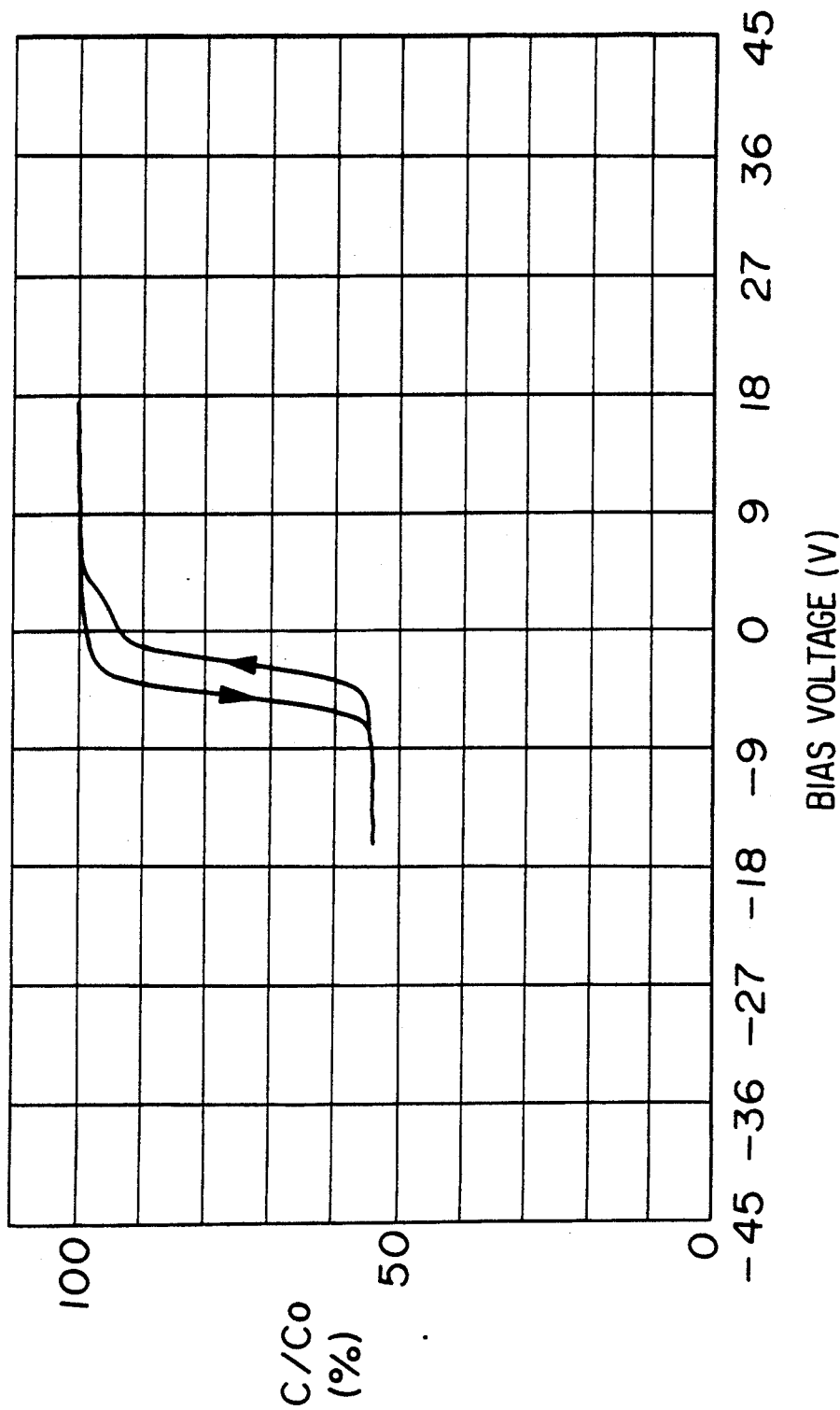

The subsequent operation was conducted in the same manner as in Example 1 except that the heat treatment temperature after spin coating was changed to 200° C., to obtain the C-V characteristics as shown in FIG. 9.

It is evident from FIG. 9 that a hysteresis appears in the C-V curve when the direction of sweepage with the bias voltage is different, and thus the polyimide resin is polarized.

EXAMPLE 5

1) Preparation of a solution of a polyimide resin precursor

Into a four necked flask equipped with a thermometer, a stirrer, a reflux condenser and an inlet for nitrogen, 8.49 g of 3,3'-dimethyl-4,4'-diaminobiphenyl was introduced and dissolved in 100 ml of NMP as the solvent. Then, the flask was dipped in a water bath of from 0° to 50° C., and while controlling the heat generation, 7.84 g of cyclobutanetetracarboxylic acid dianhydride was introduced. After the cyclobutanetetracarboxylic acid dianhydride was dissolved, the water bath was removed, and the reaction was continued at room temperature for about 10 hours to obtain a highly viscous solution of a polyimide resin precursor.

2) Measurement of a Thermal Expansion Coefficient

This solution was uniformly coated on a glass sheet by means of a coater and dried at 100° C. for 30 minutes to obtain a film. The film was peeled off from the glass sheet. Such a film was hanged with a spring and held at 170° C. and 300° C. for 60 minutes, respectively, to obtain a polyimide film having a thickness of 21 μm.

Test pieces of 4 mm×20 mm were cut out from the polyimide film, and the dimensional change was measured under a condition of 5° C./min. by a thermal mechanical tester (Thermoflex, manufactured by Rigaku Denki K.K.)

The thermal expansion coefficient of the polyimide film as calculated from the dimensional changes when the temperature was changed from 50° to 200° C., was $1.3 \times 10^{-5} K^{-1}$.

3) Measurement of Polarization Characteristics

The above solution of the polyimide resin precursor was formed into a polyimide resin film having a thickness of 2,000 Å in the same manner as in Example 1.

Figure 10:
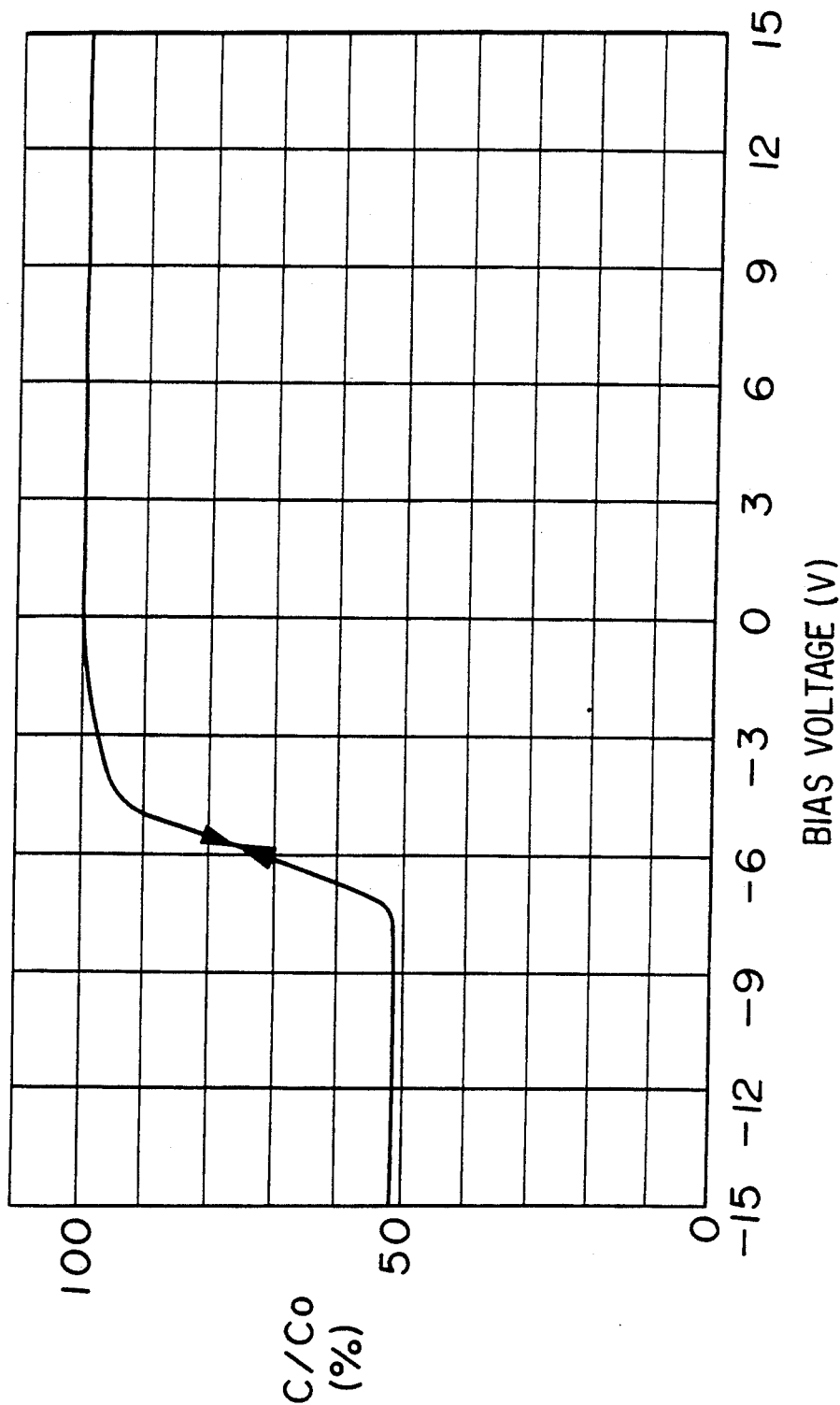

The results are shown in FIG. 10. From this Figure, it is evident that the C-V curves are consistent irrespective of the direction of sweepage with the bias voltage, and thus the polyimide resin is not polarized.

4) Evaluation of Transparency and Discoloration

The above solution of the polyimide resin precursor was spin-coated on a glass sheet and heat-treated at 300° C. for 60 minutes to obtain a polyimide resin film having a thickness of 5 μm.

This polyimide resin film had excellent transparency and no substantial discoloration.

EXAMPLE 6

The evaluation was conducted in the same manner as in Example 5 except that 4,4'-dimamino-p-terphenyl was used as the diamine, and cyclobutanetetracarboxylic acid dianhydride was used as the tetracarboxylic acid dianhydride. The results are shown in Table 1.

EXAMPLE 7

The evaluation was conducted in the same manner as in Example 5 except that 9,10-bis(4-aminophenyl)anthracene was used as the diamine, and cyclobutanetetracarboxylic acid dianhydride was used as the tetracarboxylic acid dianhydride. The results are shown in Table 1.

EXAMPLE 8

The evaluation was conducted in the same manner as in Example 5 except that 3,3'-dimethoxy-4,4'-diaminobiphenyl was used as the diamine, and cyclobutanetetracarboxylic acid dianhydride was used as the tetracarboxylic acid dianhydride. The results are shown in Table 1.

COMPARATIVE EXAMPLE 5

The evaluation was conducted in the same manner as in Example 5 except that 3,3'-dimethyl-4,4'-diaminobiphenyl was used as the diamine, pyromellitic acid dianhydride was used as the tetracarboxylic acid dianhydride and dimethylacetamide was used as the solvent. The results are shown in Table 1.

COMPARATIVE EXAMPLE 6

The evaluation was conducted in the same manner as in Example 5 except that 4,4'-diaminodiphenyl ether was used as the diamine, and pyromellitic acid dianhydride was used as the tetracarboxylic acid dianhydride. The results are shown in Table 1.

TABLE 1

| | Thermal expansion coefficient $K^{-1}$ | Polarization characteristics *1 | Transparency discoloration properties *2 |
|---|---|---|---|
| Example 5 | $1.3 \times 10^{-5}$ | Good | Good |
| Example 6 | $1.2 \times 10^{-5}$ | Good | Good |
| Example 7 | $1.7 \times 10^{-5}$ | Good | Good |
| Example 8 | $2.8 \times 10^{-5}$ | Good | Good |
| Comparative Example 5 | $1.0 \times 10^{-5}$ | Poor | Poor |
| Comparative Example 6 | $5.9 \times 10^{-5}$ | Poor | Poor |

*1 Good: No hysteresis appeared in the measurement of the C-V characteristics.
Poor: Hysteresis appeared in the measurement of the C-V characteristics.
*2 Good: Excellent transparency with no substantial discoloration.
Poor: Poor transparency with a color change to brown.

We claim:

1. A polyimide resin for an electrical insulating film having a repeating unit of the formula:

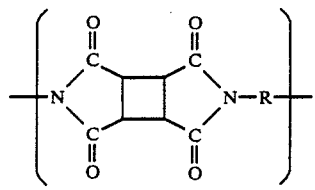

(I)

wherein R is a bivalent organic group derived from a diamine selected from the group consiting of

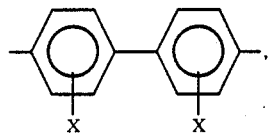

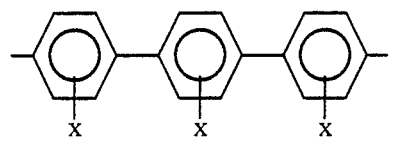

and

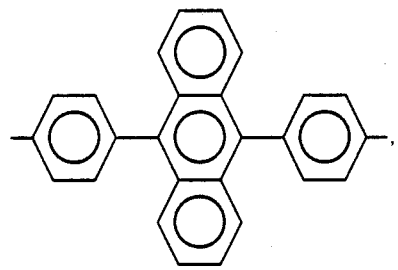

wherein X is a hydrogen atom, an alkyl group, an acyl group, an alkoxy group or a halogen atom.

* * * * *